US008281270B2

(12) United States Patent
Drennan et al.

(10) Patent No.: US 8,281,270 B2
(45) Date of Patent: Oct. 2, 2012

(54) METHOD AND SYSTEM FOR PROXIMITY-AWARE CIRCUIT DESIGN

(75) Inventors: Patrick G. Drennan, Gilbert, AZ (US); Ryan Silk, Saskatoon (CA); Joel Cooper, Saskatoon (CA); Jeffrey Dyck, Saskatoon (CA); Samer Sallam, Saskatoon (CA); Trent Lome McConaghy, Vancouver (CA)

(73) Assignee: Solido Design Automation Inc., Saskatoon (CA)

( * ) Notice: Subject to any disclaimer, the term of this patent is extended or adjusted under 35 U.S.C. 154(b) by 134 days.

(21) Appl. No.: 12/870,559

(22) Filed: Aug. 27, 2010

(65) Prior Publication Data

US 2011/0055782 A1    Mar. 3, 2011

Related U.S. Application Data

(60) Provisional application No. 61/237,320, filed on Aug. 27, 2009.

(51) Int. Cl.
*G06F 17/50* (2006.01)

(52) U.S. Cl. ........ 716/112; 716/110; 716/111; 716/118; 716/119; 716/122; 716/126

(58) Field of Classification Search .................. 716/110, 716/111, 112, 118, 119, 122, 126
See application file for complete search history.

(56) References Cited

U.S. PATENT DOCUMENTS

| | | | | |
|---|---|---|---|---|
| 7,000,208 | B2 * | 2/2006 | Zhang | 716/52 |
| 7,735,048 | B1 * | 6/2010 | Zhang et al. | 716/104 |
| 2002/0116691 | A1 * | 8/2002 | Tsai | 716/4 |
| 2004/0010764 | A1 * | 1/2004 | Zhang et al. | 716/8 |
| 2009/0307649 | A1 * | 12/2009 | Pramanik et al. | 716/19 |

OTHER PUBLICATIONS

Bowman, "An Imaging Model for Analog Macrocell Layout Generation", May 1989, IEEE International Symposium on Circuit and Systems, Technical Digest, vol. 2, pp. 1127-1130.*
Chiluvuri et al.,"Layout-Synthesis Techniques for Yield Enhancement", May 1995, IEEE Transactions on Semiconductor Manufacturing, vol. 8, Iss. 2, pp. 178-187.*
Mukherjee et al., "Automated Optimal Synthesis of Microaccelerometers", Jan. 1999, Twelfth IEEE International Conference on Micro Electro Mechnical System, Technical Digest, pp. 326-331.*
Castro-Lopez et al., "An Integrated Layout-Synthesis Approach for Analog ICs", Jul. 2008, IEEE Transactions on Computer-Aided Design of Integrated Circuits and Systems, vol. 27, iss. 7, pp. 1179-1189.*

(Continued)

*Primary Examiner* — Sun Lin
(74) *Attorney, Agent, or Firm* — Dennis R. Haszko

(57) ABSTRACT

A method for proximity-aware circuit design where a set of layout constraint values that satisfy predetermined performance or yield goals is determined in accordance with a layout effect model. One of the layout constraint values is then selected as a constraint input to layout design, and a design layout is performed with the selected layout constraint value to provide a semiconductor circuit design for the semiconductor circuit. The set of layout constraint values can be determined by varying an instance parameter of the layout effect model to determine a set of instance parameters that satisfy the at least one predetermined performance or yield goal in accordance with the layout effect model, and determining layout constraints associated with each instance parameter of the set of instance parameters, thus providing a number of candidates in a design space that can be evaluated according to performance and/or yield tradeoffs.

20 Claims, 13 Drawing Sheets

OTHER PUBLICATIONS

Graeb et al., "Analog Layout Synthesis—Recent Advance in Topological Approaches", 2009, Design, Automation & Test in Europe Conference & Exhibition, Technical Digest, pp. 274-279.*

Jones et al., "Efficient Global Optimization of Expensive Black-Box Functions", Journal of Global Optimization, vol. 13, No. 4, pp. 455-492, Kluwer Academic Publishers, Netherlands, 1998.

Deb et al., "A Fast and Elitist Multiobjective Genetic Algorithm: NSGA-II", IEEE Transactions on Evolutionary Computation, vol. 6, No. 2, pp. 182-197, Apr. 2002.

Drennan et al., "Implications of Proximity Effects for Analog Design," IEEE 2006 Custom Integrated Circuits Conference (CICC), Freescale Semiconductor, Inc., Tempe, Arizona, USA, 8 pages, 2006.

Basel et al., "Guidelines for Extracting Well Proximity Effect Instance Parameters," Compact Model Council (CMC), Revision 2.2, 17 pages, 2007.

Yang et al., "BSIM4.6.2 Mosfet Model, User's Manual", UC Berkeley, California USA, 180 pages, 2008.

* cited by examiner

METHOD AND SYSTEM FOR PROXIMITY-AWARE CIRCUIT DESIGN

CROSS-REFERENCE TO RELATED APPLICATIONS

The present application claims the benefit of U.S. Ser. No. 61/237,320 filed Aug. 27, 2009, the disclosure of which is expressly incorporated herein by reference in its entirety.

FIELD OF THE INVENTION

The present invention relates generally to proximity effects in design and manufacturing. More particularly, the present invention relates to methods of designing semiconductor circuits to handle well proximity and other layout effects earlier in the design flow.

BACKGROUND OF THE INVENTION

In the "front-end" circuit design stage, designers choose device sizes of a given circuit topology, according to power consumption, area, performance, and yield goals. In "back-end" layout design, designers specify the geometric placement for each device, and the wire routing between devices. The layout is used as specifications how to manufacture the design in a semiconductor manufacturing process.

On modern semiconductors, "well proximity" effects are becoming more of an issue (see e.g., P. G. Drennan, M. L. Kniffin, "Implications of Proximity Effects for Analog Design," Proc. 2006 IEEE CICC, September 2006, the contents of which are incorporated herein by reference). Well proximity effects occur because, during the CMOS manufacturing process, atoms can scatter laterally from the edge of the photoresist mask and become embedded in the silicon surface near the edges of the retrograde wells needed for latch-up protection and suppression of lateral punch-through. This causes the characteristics, such as the MOSFET electrical characteristics to vary with the distance of the transistor from the well-edge. The impact of well proximity effects is particularly severe at 90 nm and smaller process technologies.

Traditionally, there have been three ways to deal with proximity effects. The first way is to ignore them. FIG. 1 shows an exemplary prior art method 100 of CMOS manufacturing whereby proximity effects are ignored. According to such a method, the manufacturing process occurs in the following steps: a circuit topology is designed 102, and then the devices required by that topology are sized 104. Devices are then placed and routed 106, after which a netlist is extracted and verified 108. A circuit is then built according to the netlist 110 and the circuit is then tested 112 for functionality. But in modern CMOS processes, this is a great risk because there is a chance that the proximity effects will kill the functionality of the circuit, which will result in a costly re-design and lost time to market. In the method shown in FIG. 1, for example, because the circuit design does not account for any well proximity effects, the resulting circuit 114 could potentially be non-functional due to, for example, threshold voltage drift in certain devices that arises from the devices' proximity to a well edge.

A second known approach to circuit design is known as "guardbanding." Because it is not known at the circuit design stage which devices are sensitive to the effects, the designer uses heuristics to conservatively guard-band devices; i.e. each device is surrounded by a well with conservatively-wide safety margins. FIG. 2 shows an example of such method 200. The first steps of designing the topology 202 and sizing the necessary devices 204 proceeds as in FIG. 1. However, prior to netlist extraction and verification 208, this method introduces wide spacing 206 between each device sensitive to a proximity effect and the well edges in the circuit design. Unfortunately, this method results in area penalties.

A third prior art approach is shown in FIG. 3. According to this method, the circuit designer designs a circuit topology 302, sizes the necessary devices 304, places & routes the devices 306 and extracts a netlist from the determined layout as in the method set out in FIG. 1. Then, the designer simulates to determine if there are any proximity effect-related issues. If there are issues, the designer must alter the design, and repeat the process 307. Because the process is iterative, and done after layout, it causes design time penalties.

Besides proximity effects, there are other layout-style effects that are becoming more of a concern, including shallow trench isolation (STI) stress and channel stress. To handle these effects, designers currently use many of the techniques used to handle proximity effects: either guardbanding can be used, which causes area penalties; or an iterative process involving layout in the loop can be used, which causes design time penalties.

SUMMARY OF THE INVENTION

It is an object of the present invention to obviate or mitigate at least one disadvantage of previous methods and associated tools for handling well proximity and layout-style effects.

There is provided a computer-implemented method, and a computer-readable medium storing non-transitory instructions for performing the method, of proximity-aware circuit design for a selected circuit topology for a semiconductor circuit having at least one predetermined performance or yield goal. For each device in the circuit topology, the method comprises determining a set of layout constraint values that satisfy the at least one predetermined performance or yield goal in accordance with a layout effect model; selecting one of the set of layout constraint values as a constraint input to layout design; and performing a design layout in accordance with the selected one of the set of layout constraint values to provide a semiconductor circuit design for the semiconductor circuit. The method can further comprise placing and routing each of the devices in accordance with its respective selected one of the set of layout constraint values to optimize the circuit design in accordance with circuit specifications; and verifying the circuit design, as are known in the art. According to embodiments, sizing of the devices in the circuit topology and determining the set of layout constraint values that satisfy the at least one predetermined performance or yield goal in accordance with the layout effect model can be performed together.

According to embodiments, selecting the one of the set of layout constraint values as the constraint input to layout design can comprise selecting the one of the set of layout constraint values in view of trade-offs between performance and yield goals. According to specific embodiments, the layout effect model can comprise a well proximity effect model, and/or a shallow trench isolation (STI) stress model.

Determining the set of layout constraint values that satisfy the at least one predetermined performance or yield goal in accordance with the layout effect model can comprise varying an instance parameter of the layout effect model to determine a set of instance parameters that satisfy the at least one predetermined performance or yield goal in accordance with the layout effect model; and determining layout constraints associated with each instance parameter of the set of instance parameters to provide the set of layout constraint values. For example, a set of minimum well distance values that satisfy the at least one predetermined performance or yield goal in accordance with a well proximity effect model can be determined. This can be achieved by varying an instance parameter (SCA) representing an integral of a first distribution function for scattered well dopants to determine a set of instance parameters that satisfy the at least one predetermined performance or yield goal in accordance with the well proximity effect model; and determining well keep-out constraints associated with each instance parameter of the set of instance parameters to provide the set of minimum well distance values. In an embodiment, the well proximity effect model models at least one of threshold voltage ($V_{th}$), a second-order body bias coefficient (K2) and effective mobility ($\mu_{eff}$) as a function of SCA.

Other aspects and features of the present invention will become apparent to those ordinarily skilled in the art upon review of the following description of specific embodiments of the invention in conjunction with the accompanying Figures.

BRIEF DESCRIPTION OF THE DRAWINGS

Embodiments of the present invention will now be described, by way of example only, with reference to the attached drawings, wherein.

DETAILED DESCRIPTION

Generally, the present invention provides a computer-implemented method for proximity-aware circuit design, and a computer-readable medium storing non-transitory instructions, which, when executed by a processor, cause the processor to perform the proximity-aware circuit design method. The method generally comprises determining a set of layout constraint values that satisfy predetermined performance or yield goals in accordance with a layout effect model. One of the set of layout constraint values is then selected as a constraint input to layout design, and a design layout is performed in accordance with the selected one of the set of layout constraint values to provide a semiconductor circuit design for the semiconductor circuit. The set of layout constraint values can be determined by varying an instance parameter of the layout effect model to determine a set of instance parameters that satisfy the at least one predetermined performance or yield goal in accordance with the layout effect model, and determining layout constraints associated with each instance parameter of the set of instance parameters, thus providing a number of candidates in a design space that can be evaluated according to performance and/or yield tradeoffs.

In the following description, for purposes of explanation, numerous details are set forth in order to provide a thorough understanding of the present invention. However, it will be apparent to one skilled in the art that these specific details are not required in order to practice the present invention.

Figure 11:
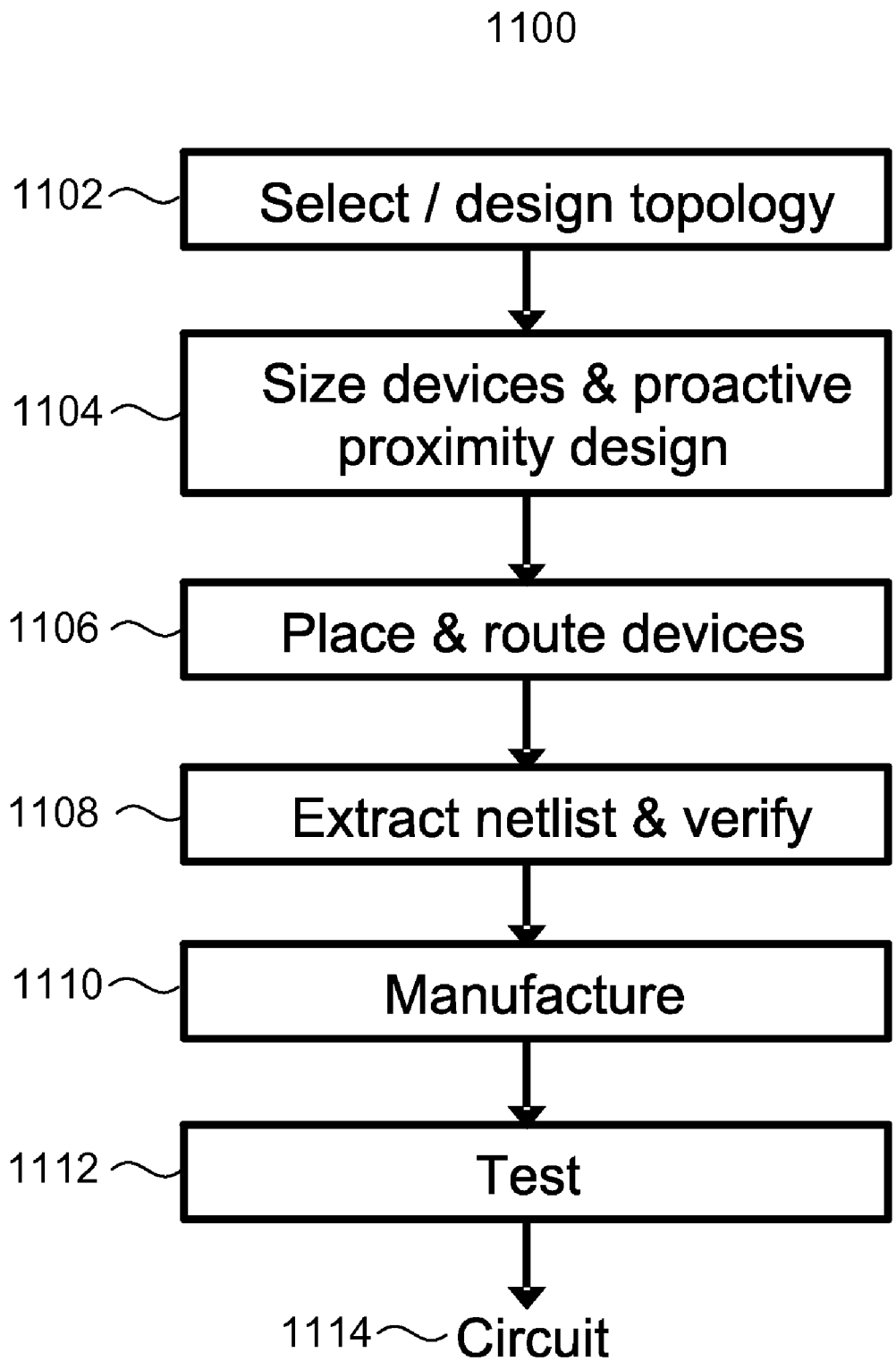
FIG. 11 shows a method of CMOS circuit manufacturing according to another embodiment of the present invention, whereby designing for proximity effects during sizing accounts for interactions between device sizes and SCA variables, for possibly further improved area savings.

The present disclosure has an exemplary embodiment shown in FIG. 4, which will be described below. Another exemplary embodiment is shown in FIG. 11.

Figure 1:
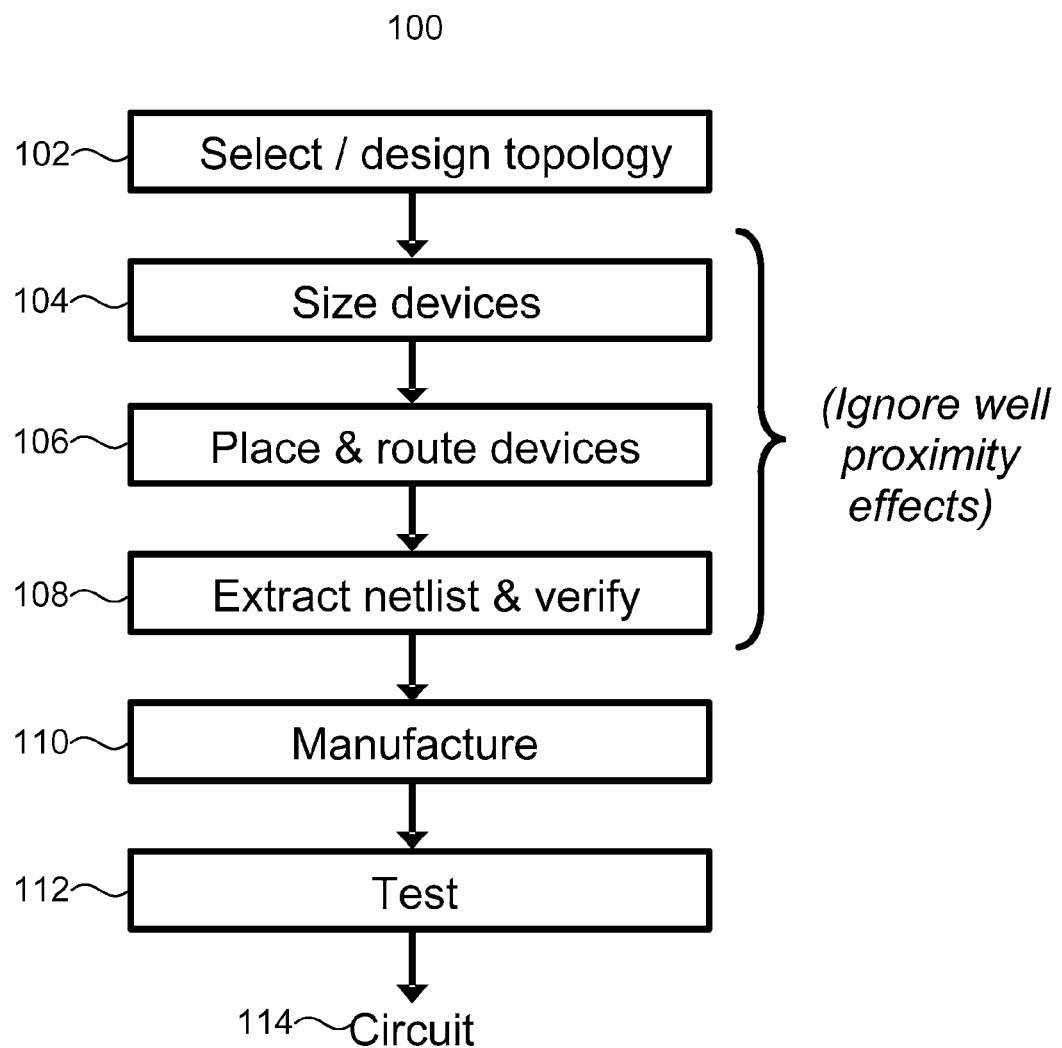
FIG. 1 shows a prior art method of CMOS circuit manufacturing whereby proximity effects are ignored.
Figure 2:
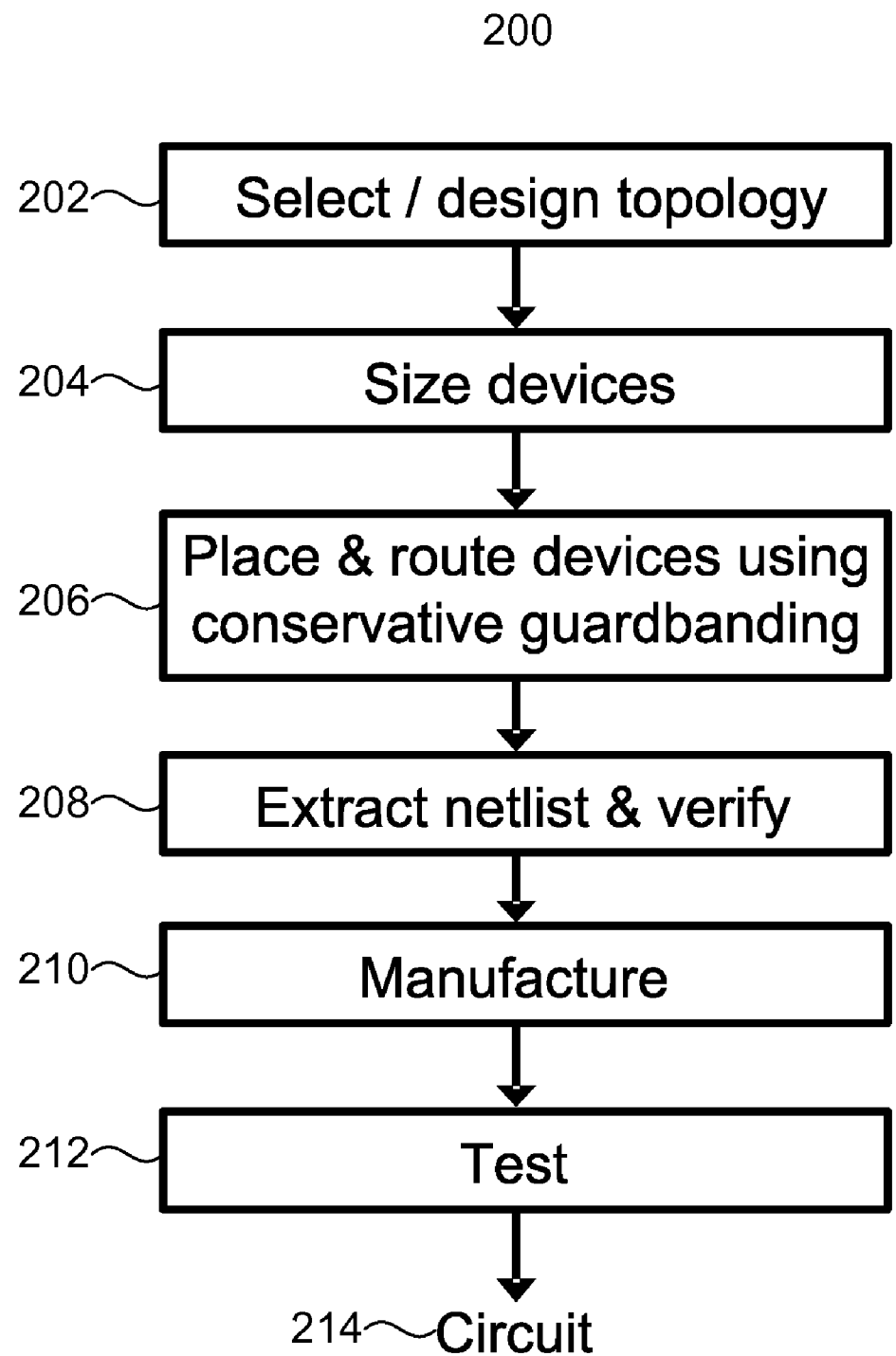
FIG. 2 shows a prior art method of CMOS circuit manufacturing using conservative guardbanding.
Figure 3:
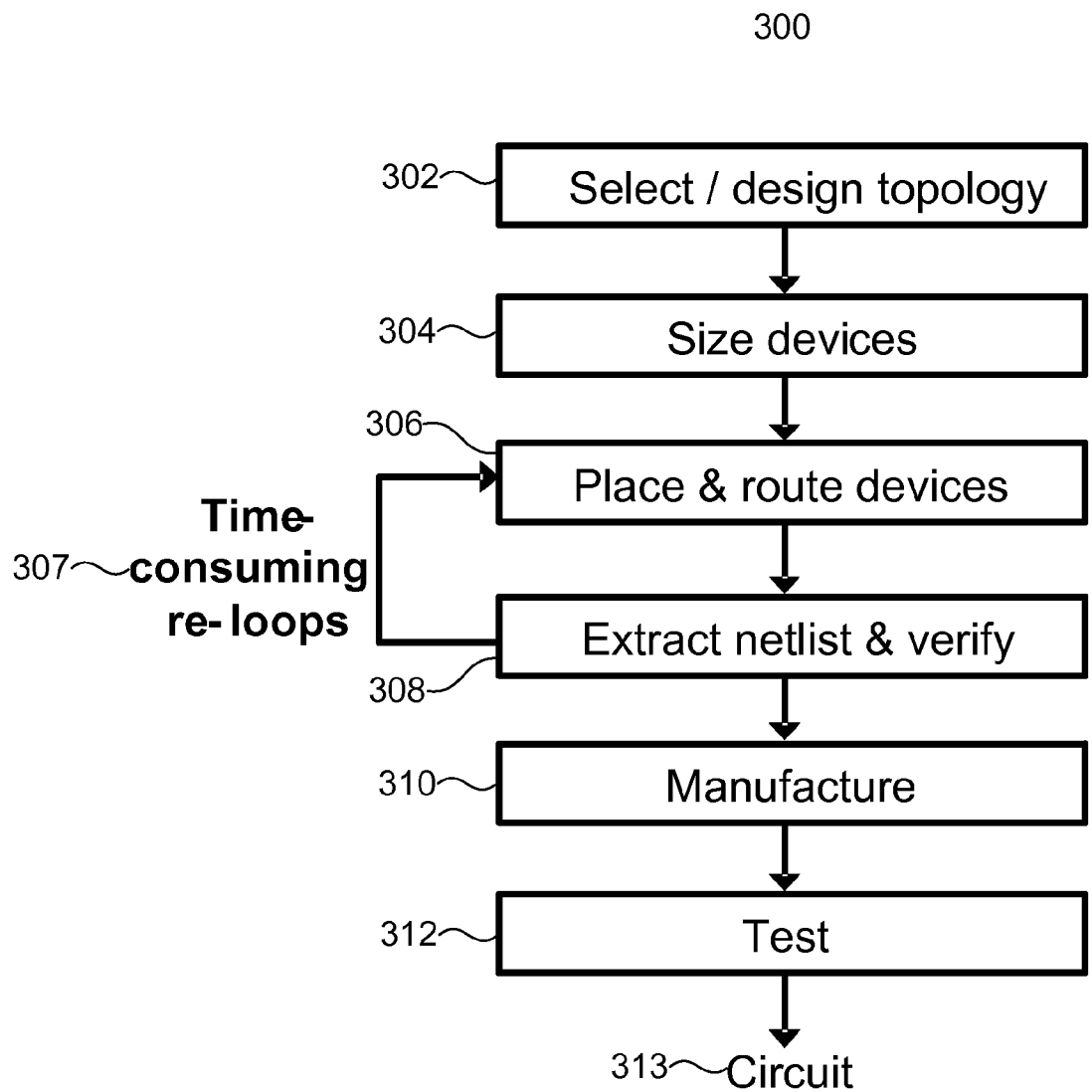
FIG. 3 shows a prior art method of CMOS circuit manufacturing where proximity issues are deferred to the layout stage, where they are addressed by simulations involving iterative re-loops.
Figure 4:
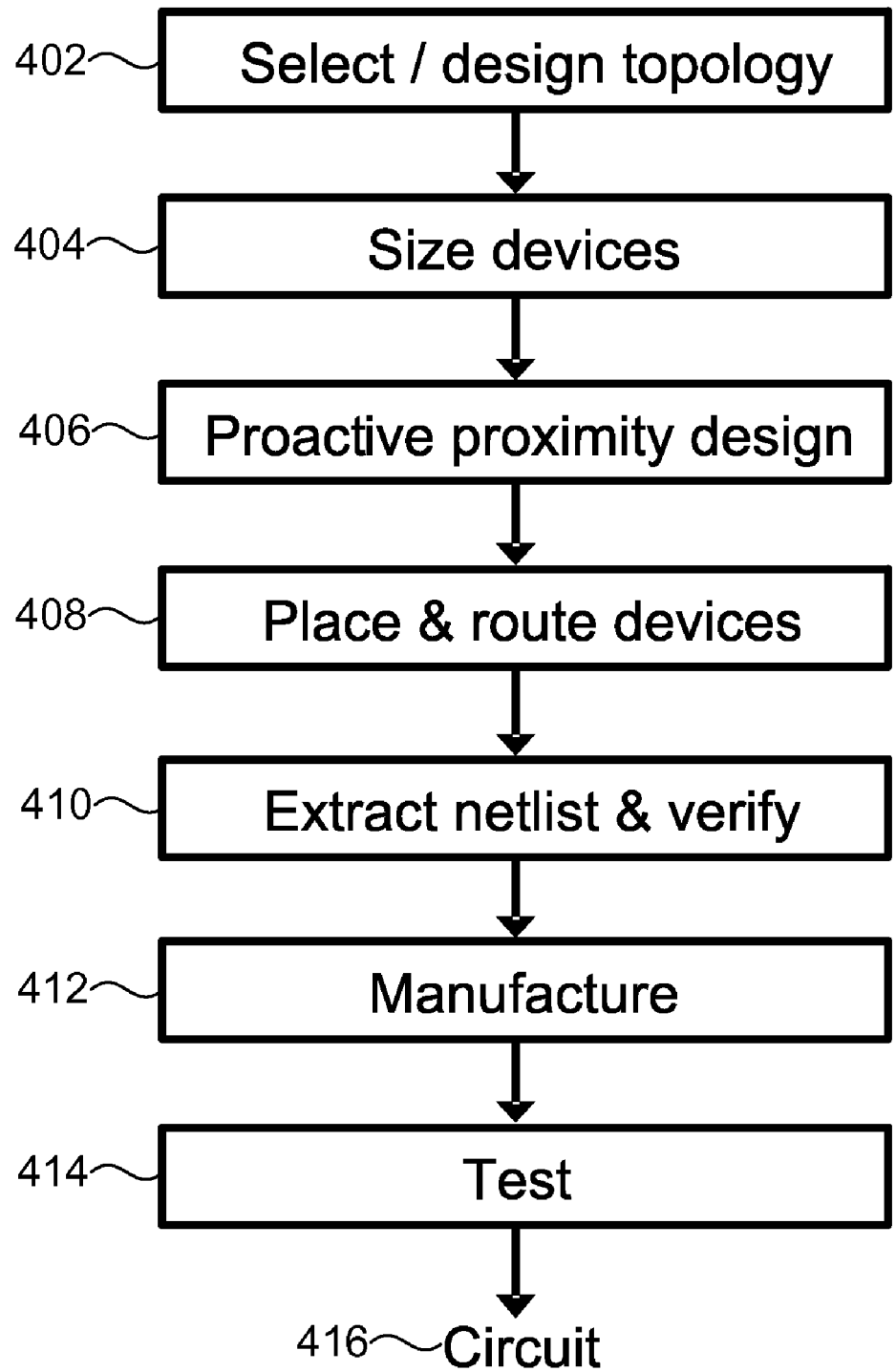
FIG. 4 shows a method of CMOS circuit manufacturing according to one embodiment of the present invention, whereby proximity effects are dealt with proactively, before layout.

In FIG. 4, the design process 400 proceeds as follows. The designer selects or designs a topology 402 according to accepted practices. Sizing 404 can also be done according to accepted practices, which may or may not include accounting for environmental effects or statistical process variation. There may be elements of automation in these steps. When the sizing step is complete, the next step would traditionally be layout. But according to present embodiments, there is a new step that precedes layout: a proactive proximity design step 406. In this step, layout effect models such as a model of the effects of well proximity on performances and/or yield are used as a guide, in order to determine constraint inputs such as a minimum well distance value for each device that will preserve the predetermined performance/yield goals. Models of various layout effects on various aspects of device functionality such as threshold voltage are known in the art and discussed in greater detail below.

In the layout step of placing and routing devices 408 that follows, the minimum well distances are input as extra constraints on the layout design. Other than having these extra constraints, layout proceeds in the usual fashion. After layout, steps of verification 410, manufacturing 412, and testing 414 follow in the usual way, yielding a circuit 414 that is robust to proximity effect.

Figure 5:
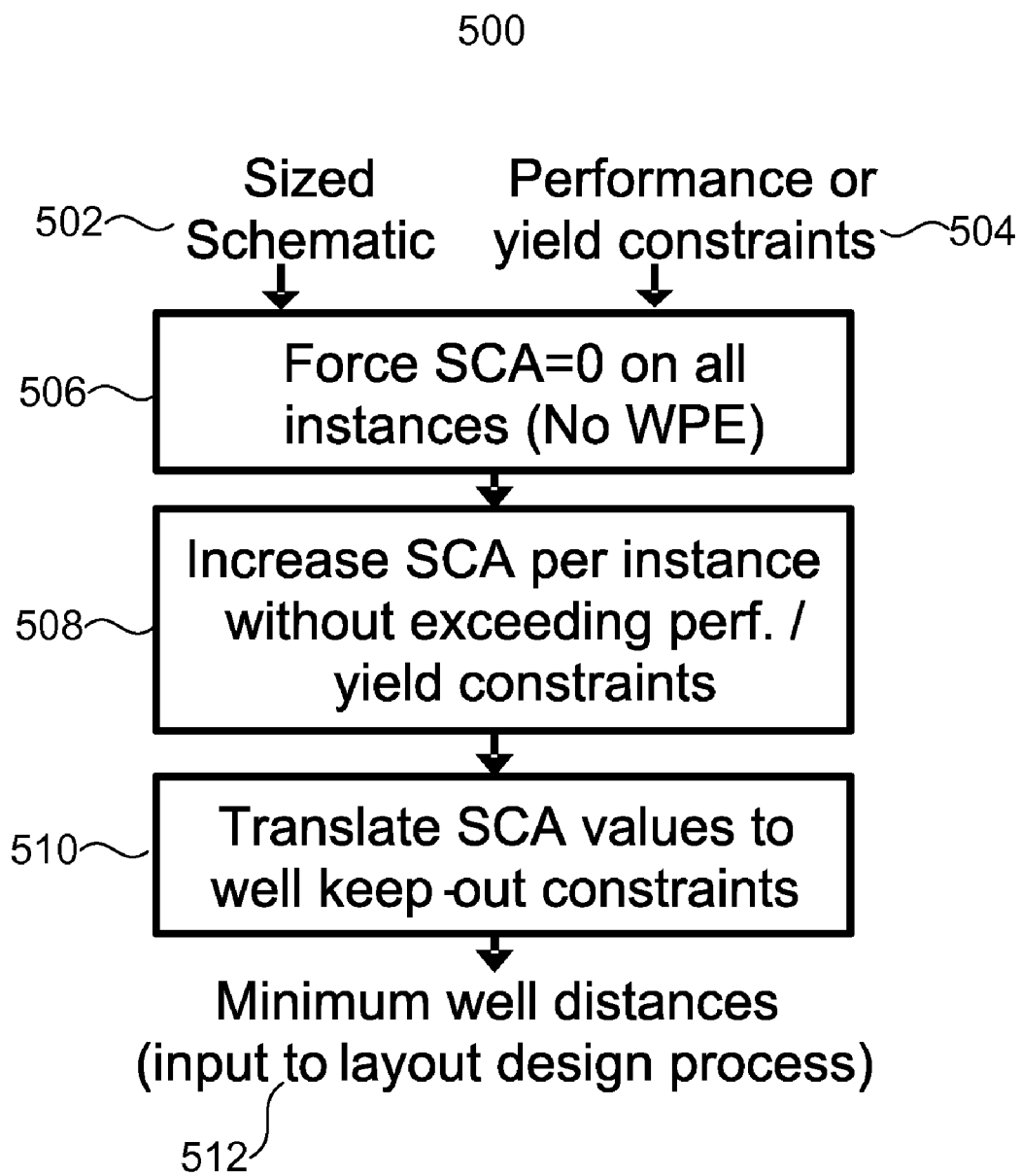
FIG. 5 shows details of the proactive proximity design step according to an embodiment of the present invention that assumes no interactions among proximity constraint variables (SCA).

The proximity design step 406 introduced in FIG. 4 has many embodiments. FIG. 5 is one such embodiment 500, which aims to minimize area of a sized schematic 502 while meeting performance/yield constraints 504. In this embodiment, the first step is, for each device, to force its proximity variable SCA to 0 506. SCA is an instance parameter for the well proximity effect model that represents the integral of the first distribution function for scattered well dopants. The SCA parameter is given by the following equation:

$$SCA = \left\{ \frac{1}{W_{drawn} \cdot L_{drawn}} \cdot \left[ \sum_{i=1}^{n} \left( W_i \cdot \int_{SC_i}^{SC_i + L_{drawn}} \frac{SC_{ref}^2}{u^2} du \right) + \sum_{i=n+1}^{m} \left( L_i \cdot \int_{SC_i}^{SC_i + W_{drawn}} \frac{SC_{ref}^2}{u^2} du \right) + \text{corners\_}A \right] \right\}$$

Figure 5A:
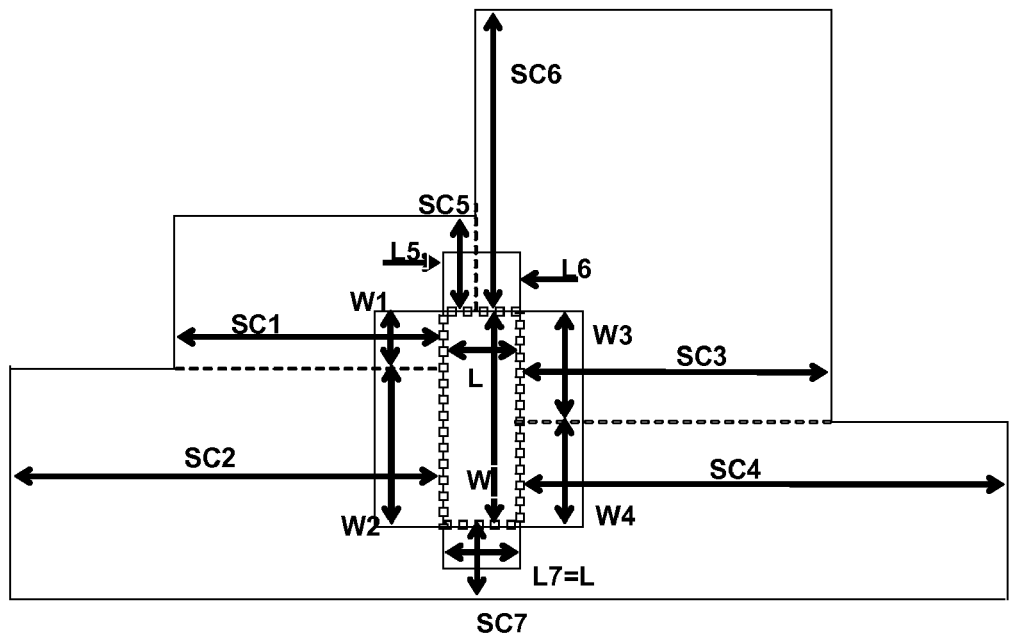
FIG. 5A shows the geometry of a MOSFET device in relation to exemplary well edges at various distances.

Where, $W_{drawn}$ and $L_{drawn}$ are the mask level channel width and length provided as input parameters. SC represents the distance between the gate edge and the well edge, and the variable n is the number of projections of the well edge along the width of the device for which SC is constant. The variable m is the number of projections of the well edge along the length of the devices for which SC is constant. $SC_{ref}$ is a set reference distance (i.e., $SC_{ref}=1$ μm). Exemplary geometry of values of L, W and SCA are shown in FIG. 5A, where W1 through W4 are various width distances, L1 through L7 are various length distances and SC 1 through SC7 are various well edge distances.

The variable, corners_A, accounts for the impact of scattered well dopants from well corners outside the projection regions, and is given by:

$$\text{corner\_}A = \sum_{i=m+1}^{m+k} \left( \frac{L_{drawn}}{2} \int_{SCX_i + SCY_i}^{SCX_i + SCY_i + W_{drawn}} f_A(u) du \right) + \sum_{i=n+1}^{n+k} \left( \frac{W_{drawn}}{2} \int_{SCX_i + SCY_i}^{SCX_i + SCY_i + L_{drawn}} f_A(u) du \right)$$

Figure 5B:
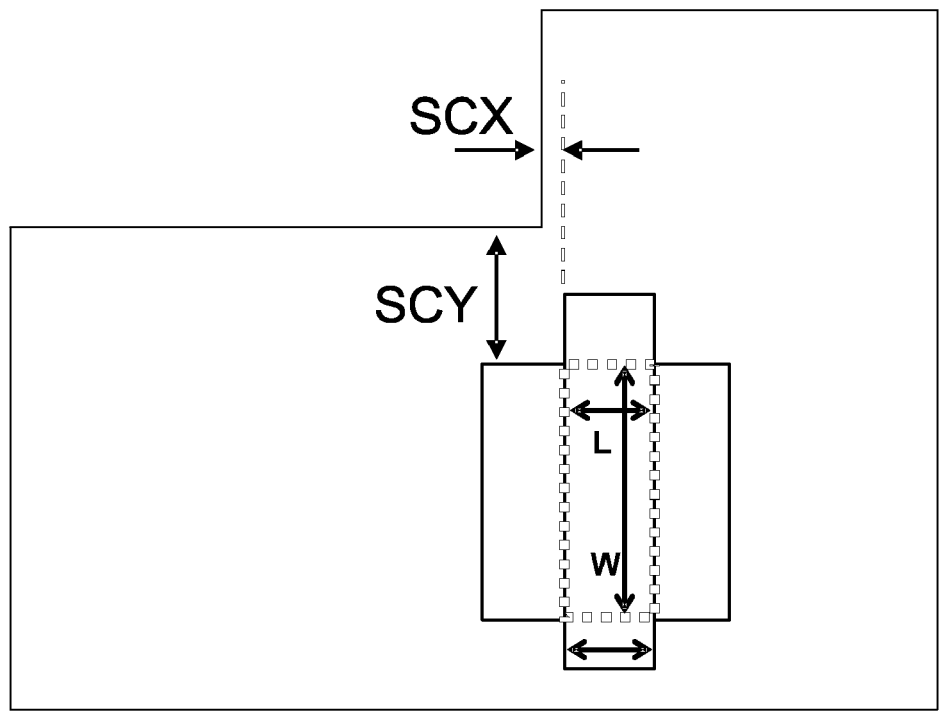
FIG. 5B shows the geometry of a MOSFET device in relation to an exemplary well corner.

Where, SCX and SCY are distances between well edges and edges of a MOSFET device as shown in FIG. 5B.

A detailed definition and explanation of the SCA instance parameter can be found in M. Basel, et al., "Guidelines for Extracting Well Proximity Effect Instance Parameters," (Compact Model Council, 2007) and Tanvir Hasan Morshed, et al., "BSIM4.6.2 MOSFET Model User's Manual," (California: UC Berkeley, 2008), the contents of which are incorporated herein by reference.

Figure 6:
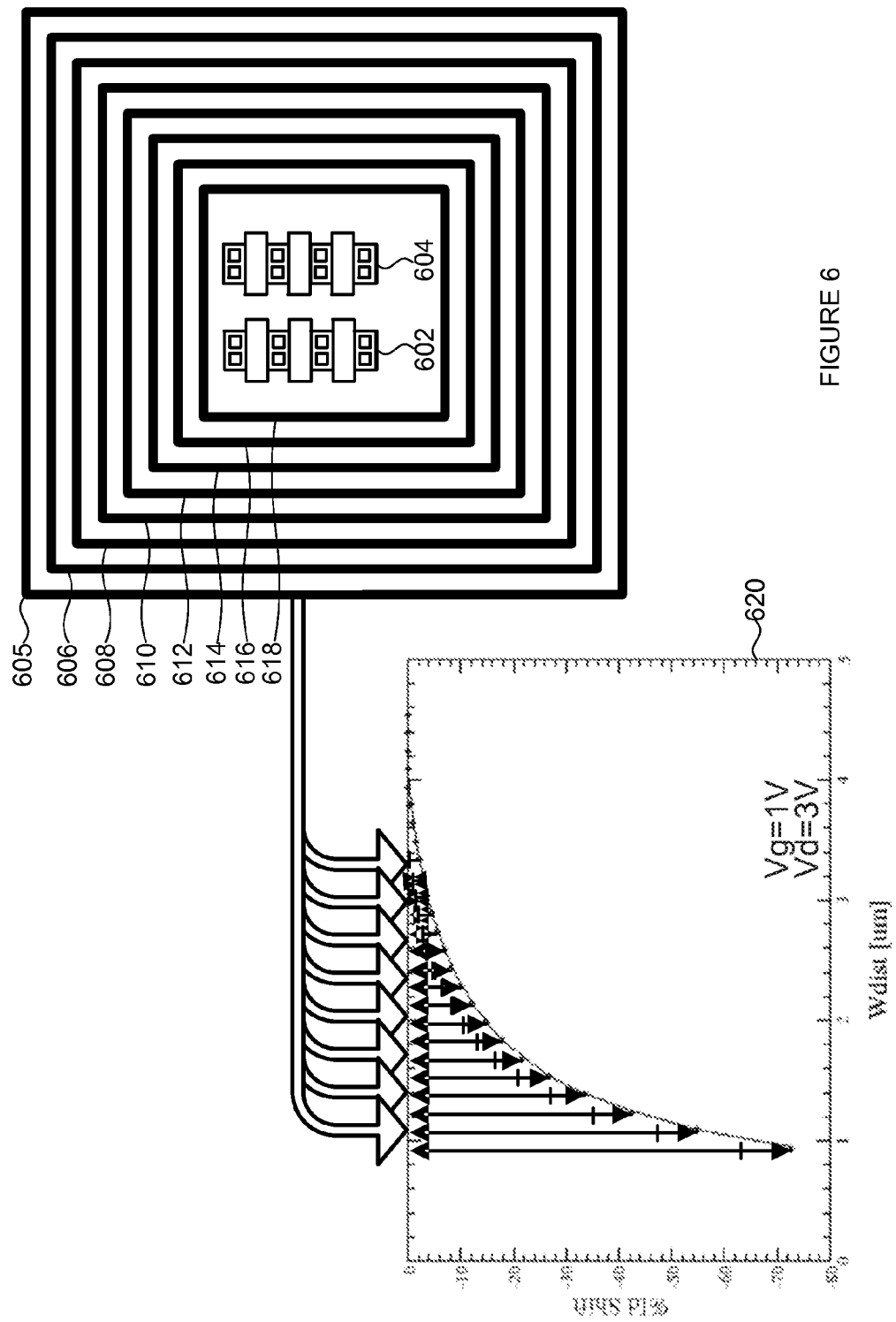
FIG. 6 shows an example of a relationship between different well sizes and the effect on drain current ($I_d$), for a differential pair subcircuit.

Because SCA values and well distances are inversely related, the step 506 of setting SCA to 0 is equivalent to making each device's guardband very large (relative to the size of the device), and therefore making the performance parameters substantially insensitive to well proximity effects (to the detriment of area, of course). FIG. 6 illustrates how the performance parameter Id of devices 602 and 604 changes as a function of well distance. In this example, drain current Id is shown for a variety of distances 605, 606, 608, 610, 612, 614, 616 and 618 between devices 602 and 604. As the curve 620 shows, Id shift decreases exponentially as well edge distance increases.

Returning to FIG. 5, the next step is to increase each device's SCA value 508 until it is on the edge of having too much performance/yield degradation. This involves evaluating the performance/yield of a vector of SCA values according to appropriate device models to account for layout effects, and in view of process parameters supplied by the foundry in modern CMOS processes. An example of such a layout effect model is the well proximity effect model, described in "BSIM4.6.2 MOSFET Model User's Manual" referenced above. This model defines the following components:

$$Vth0 = Vth0_{org} + KVTH0WE \cdot (SCA + WEB \cdot SCB + WEC \cdot SCC)$$

$$K2 = K2_{org} + K2WE \cdot (SCA + WEB \cdot SCB + WEC \cdot SCC)$$

$$\mu_{eff} = \mu_{eff,org} \cdot (1 KU0WE \cdot (SCA + WEB \cdot SCB + WEC \cdot SCC))$$

$V_{th0}$ is the threshold voltage of the long channel device at zero substrate bias and $Vth0_{org}$ is the "ideal" threshold voltage for the device, assuming no shift due to proximity effects. KVTH0WE is a threshold shift factor for well proximity effect.

K2 is a second-order body bias coefficient, and $K2_{org}$ is the "ideal" coefficient for the device, assuming no shift due to proximity effects.

$\mu_{eff}$ is the effective mobility, while $\mu_{eff,org}$ represents the mobility of the device assuming no proximity effects. KU0WE is a device's mobility degradation factor for well proximity effect.

Note that in each of the above, SCB and SCC are further instance parameters that represent the integral of the second and third distribution function for scattered well dopants, while WEB and WEC are their respective coefficients. In certain embodiments of the invention, these terms become negligible and can be set to zero. By incrementing SCA over a range of values, a set of values for $V_{th0}$, K2 and $\mu_{eff}$ can be calculated and compared or correlated to desired performance and/or yield values. For those SCA values that result in acceptable performance and/or yield values, the minimum well distances (SCi) can be determined, and can be subsequently used as layout constraints in the layout design.

By applying models such as those set out above over a range of SCA values, the simulator will return performance values for the given SCA value at given environmental/statistical variation conditions. When done over a set of SCA values, the method can provide a set of instance parameters that satisfy a predetermined performance or yield goal, resulting in a set of candidate values in a design space. The process can therefore be methodical rather than iterative, as "trial and error" simulations may not be necessary.

If the SCA vector is evaluated at more than one "corner" of environmental/statistical variations, then the worst-case performance values across these corners can be taken. If there is a constraint on yield, then yield degradation may be estimated by a priori computing the sensitivity of yield to each performance, then simply multiplying those sensitivities with the measured performance degradations. Once the SCA values are determined, the next step in the flow of FIG. 5 is to translate the SCA values to layout constraint values such as well keep-out values 510, which, in turn, provides a set of minimum well edge distances 512 that can be made available to the layout designer as extra attributes on each device or as machine-readable constraints. The designer can take these constraints into account during the remaining steps in the circuit design process shown in FIG. 4, namely, placing and routing devices 408, extracting a netlist and verifying 410, manufacturing 412 and testing 414.

Figure 7:
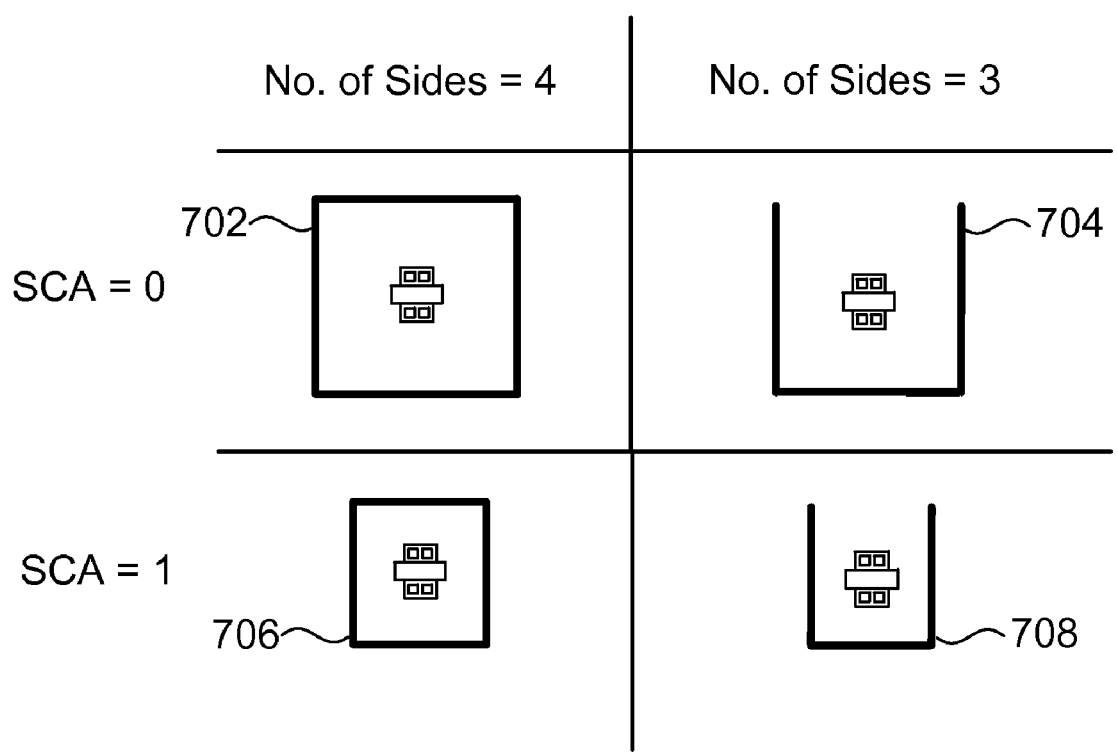
FIG. 7 shows an example of translating a device's SCA parameter to a well distance keep-out box with both three and four sides.
Figure 8:
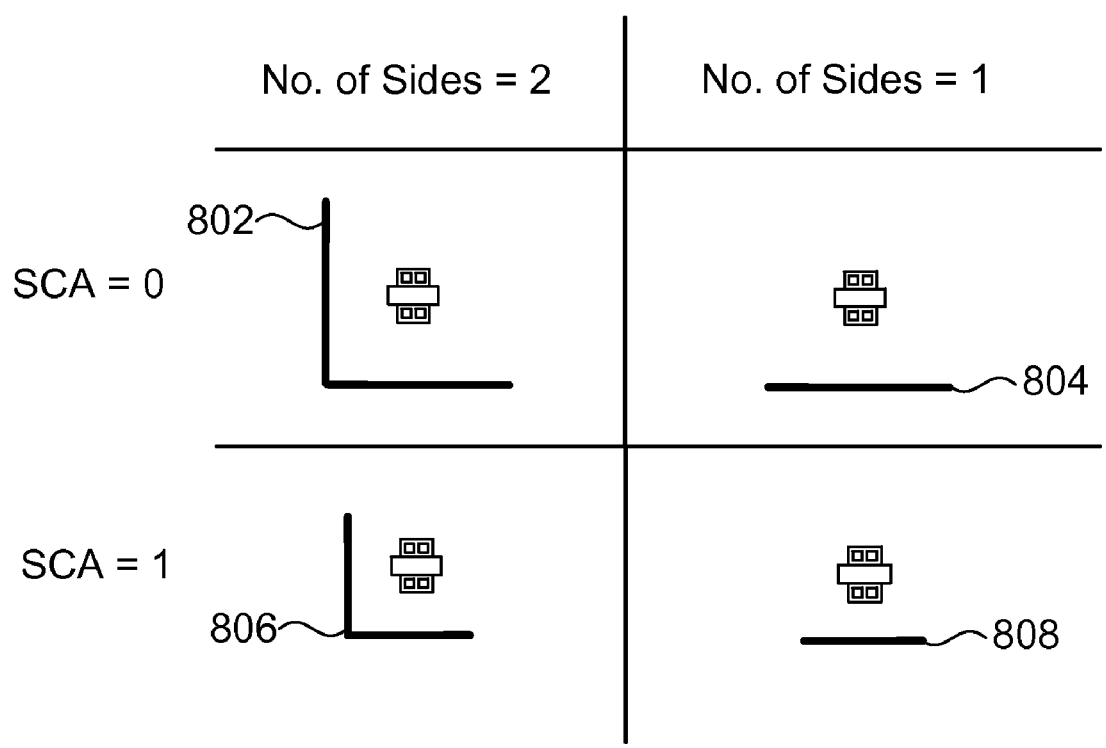
FIG. 8 shows an example of translating a device's SCA parameter to a well distance keep-out box with both one and two sides.

FIGS. 7 and 8 show that this translation is dependent on the number of well edges that a device is beside. FIG. 7 shows an example of a device surrounded on all four sides by well edges, and how the distance between the device and these well edges decreases as SCA is increased 702, 706. FIG. 7 also shows an example of device surrounded on three sides by well edges at two different SCA values 704, 708. FIG. 8 shows a similar relationship between SCA and well edge distance for a device surrounded by well edges on two sides 802, 806 and on one side 804, 808.

Figure 9:
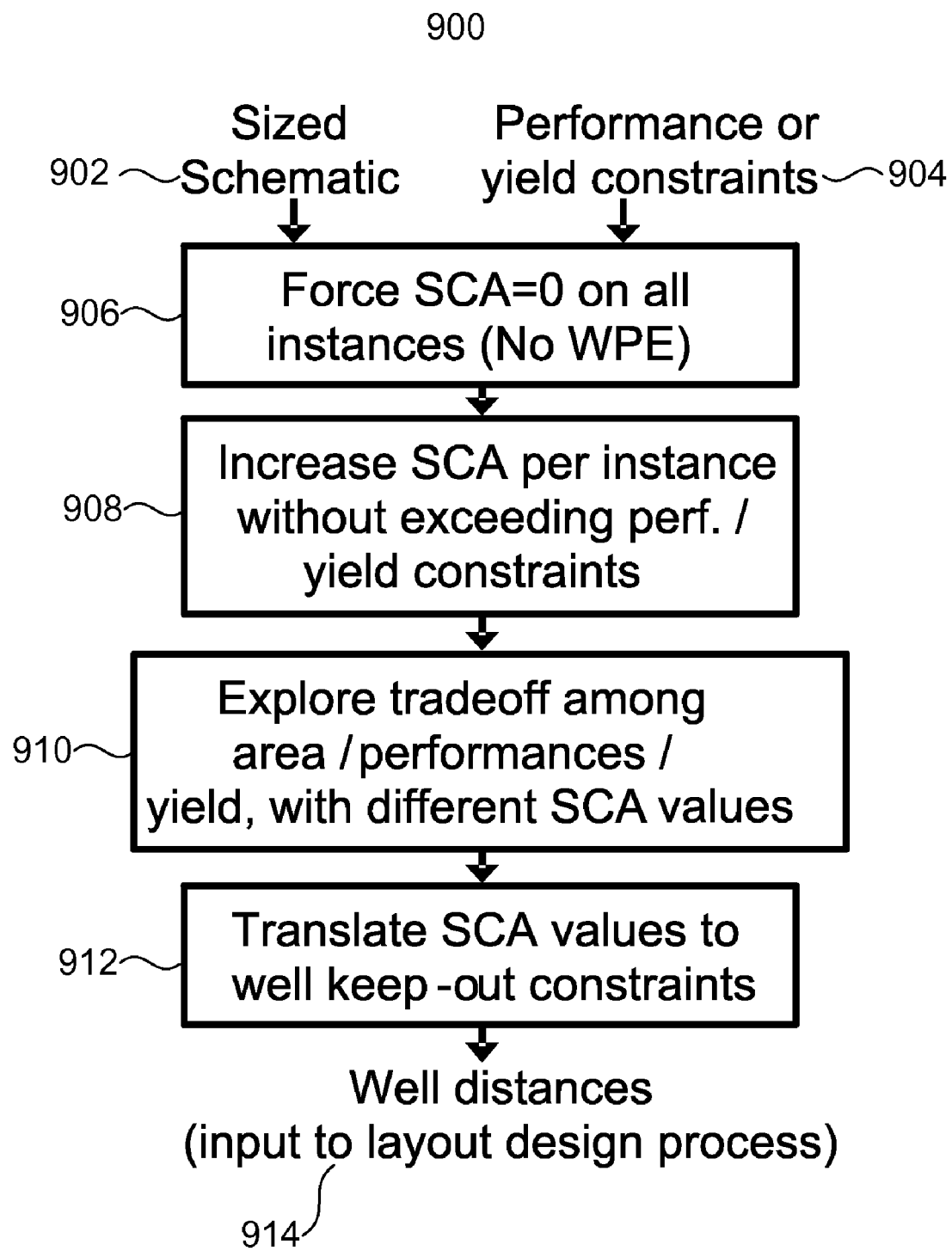
FIG. 9 shows details of the proactive proximity design step according to another embodiment of the present invention that assumes no interactions among SCA variables, but allows for the exploration of different SCA values in order to explore the tradeoff among different performances/yield.

FIG. 9 shows an alternative embodiment for the proximity design step introduced in FIG. 4. This embodiment is similar to that of FIG. 5, except there is now a step 910 which gives provision for exploring the tradeoffs among area, performances, and yield. Different SCA (or well distance) values can be considered, in a fashion that may include manual or automatic processes. Proactive proximity design in accordance with this embodiment can provide a set of SCA values, or candidates in design space, each of which may satisfy the various constraints provided for a given device. A designer may then compare each candidate by exploring the effect each one may have on variables such as RF interference or any other aspect of the device's functionality. For example, starting with the minimal-area performance-meeting baseline design the designer may try a different well distance value for a given transistor, in order to see if it may reduce the power consumption at the cost of slightly increased area. After this exploration of area/performance/yield, a single vector of SCA values is chosen, for example through a manual inspection by the designer of the tradeoff values.

As noted above, other layout effect models such as the STI stress model can also be used to take into account other layout effects according to some embodiments of the present disclosure. In the case of the STI stress model, the instance parameters can include SA and SB, which are defined as the distance between an OD edge and a device's poly, and SD, which is defined as the distance between neighboring device fingers (see e.g., "BSIM4.6.2 MOSFET Model User's Manual" referenced above).

Figure 10:
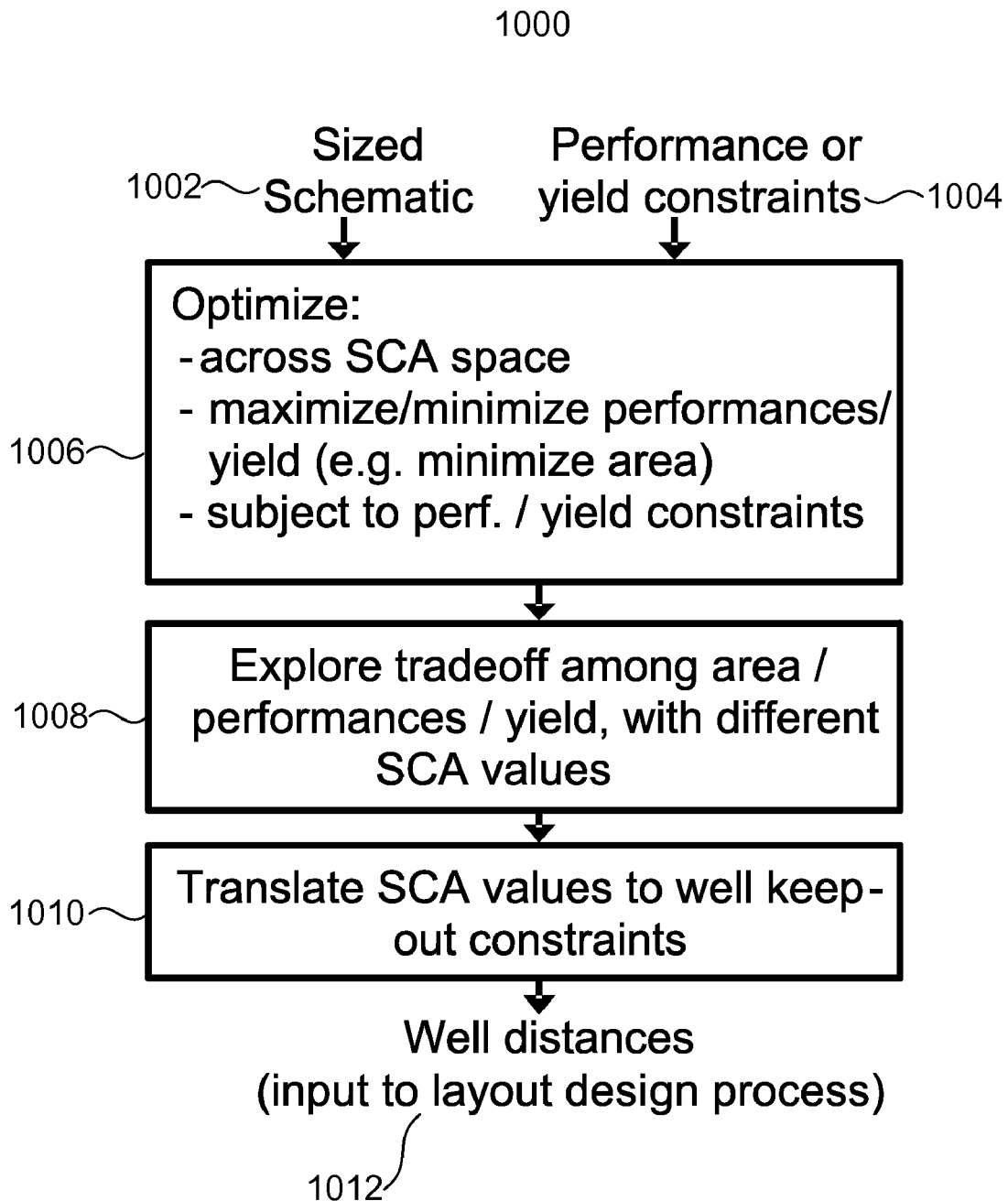
FIG. 10 shows details of the proactive proximity design step according to another embodiment of the present invention that allows for interactions among SCA variables, and may allow for the exploration of different SCA values in order to explore the tradeoff among different performances/yield.

FIG. 10 shows another alternative embodiment for a proximity design step as shown in FIG. 4. This embodiment is similar to that shown in FIG. 9, except that the possible effects of interactions among SCA variables on performance/yield are now accounted for 1006, and different objectives and constraints are possible. Examples of such objectives could be minimizing power, maximizing yield, etc. In one embodiment, area could be a constraint rather than an objective to minimize. The overall step 1006 can be cast as a general constrained single or multi-objective optimization problem, which can then be approached by either manual or automated means. An exemplary automated means to approach this is using an off-the-shelf optimizer, such as a constrained multi-objective evolutionary algorithm like NSGA-II (K. Deb, A. Pratap, S. Agarwal, and T. Meryarivan, "A fast and elitist multi-objective genetic algorithm: NSGA-II", IEEE Transactions on Evolutionary Computation, Vol. 6, 2002, pp. 182-197, which is incorporated herein by reference). Highly efficient optimization approaches that use response surface modeling are also applicable, such as EGO (D. R. Jones, M. Schonlau, and W. J. Welch, "Efficient global optimization of expensive black-box functions", *Journal of Global Optimization*, Vol. 13, No. 4, December 1998, pp. 455-492, which is incorporated herein).

FIG. 11 shows another exemplary embodiment of the invention. This embodiment is similar to the embodiment shown in FIG. 4, except that it can account for possible interactions between sizing variables and proximity variables by considering them simultaneously. Accordingly, in FIG. 11, the steps of "size devices" and "proactive proximity design" of FIG. 4 are merged into a single step, "size devices & proactive proximity design" 1104. In this step, the design space is the union of the set of possible sizings and the set of possible SCA (and, by extension, well distance) values. By accounting for possible interactions, if the interactions are significant, then there are opportunities to achieve designs with improved area, performance, or yield.

Figure 12:
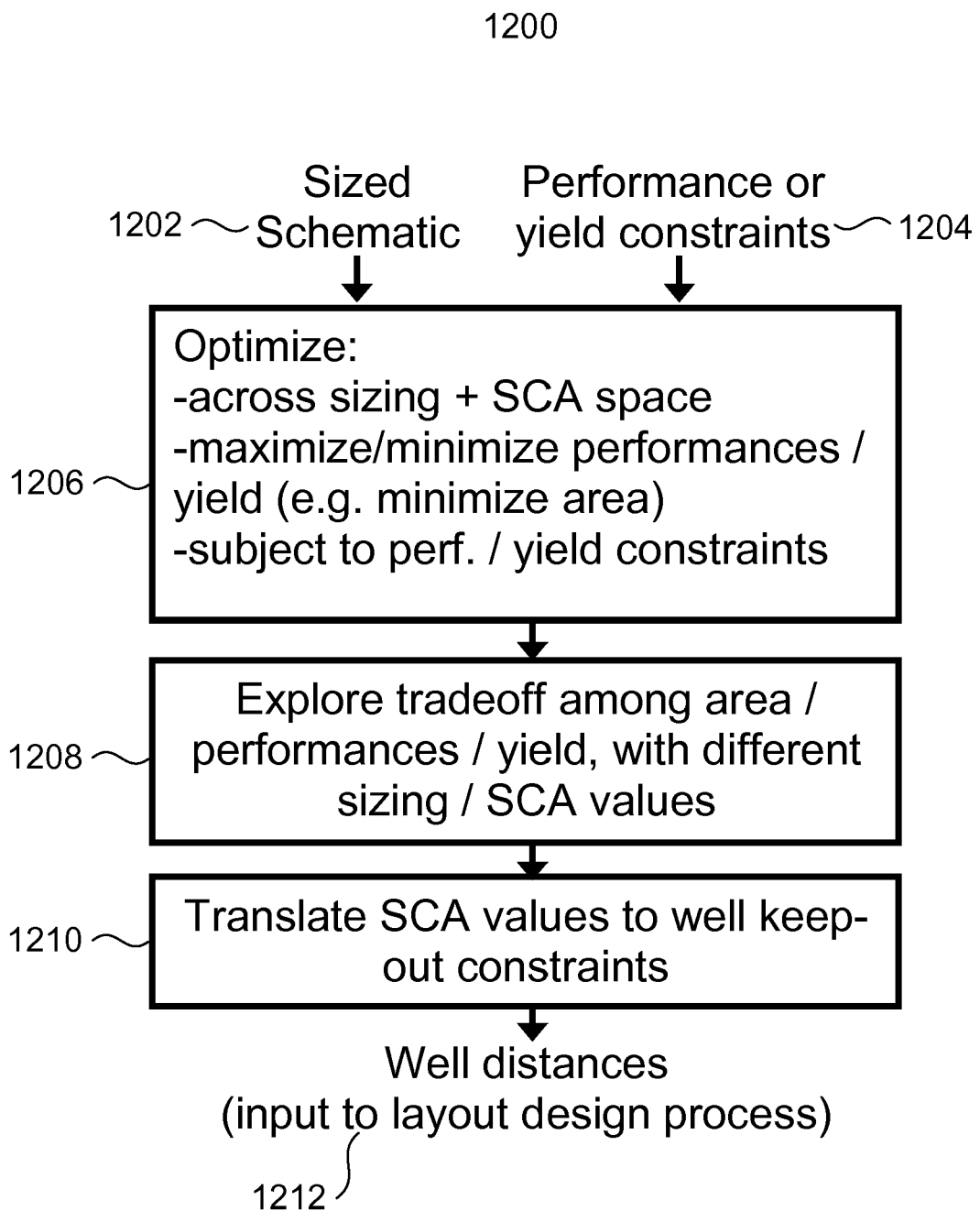
FIG. 12 shows details of the combined sizing/proactive proximity design step according to an embodiment of the present invention that accounts for interactions among device sizes and SCA variables, and for the possibility of exploring the tradeoffs among performances/yield as sizing/SCA values change.

FIG. 12 shows an exemplary embodiment of the "size devices & proactive proximity design" step introduced in FIG. 11. This embodiment is similar to that of FIG. 10, except now the design space has been expanded to include sizing variables. Like FIG. 10, this step 1206 can be manual or automated. An example approach would be to do manual sizing first (e.g. with big well distances), then to automatically choose minimal-area well distances, then identify the handful of sizing and SCA variables with the highest impact, and manually explore different values of those variables until convergence upon a desirable solution.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A computer-implemented method of proximity-aware circuit design for a selected circuit topology for a semiconductor circuit having at least one predetermined performance or yield goal, comprising:
 for each device in the selected circuit topology, determining a set of layout constraint values that satisfy the at least one predetermined performance or yield goal in accordance with a layout effect model;
 selecting one of the set of layout constraint values as a constraint input to layout a design for said each device; and
 performing a design layout in accordance with the selected one of the set of layout constraint values for said each device to provide a semiconductor circuit design for the semiconductor circuit.

2. The method as claimed in claim 1 further comprising:
 placing and routing each of devices in the selected circuit topology in accordance with its respective selected one of the set of layout constraint values to optimize the semiconductor circuit design in accordance with circuit specifications; and
 verifying the semiconductor circuit design.

3. The method as claimed in claim 1 wherein the selecting one of the set of layout constraint values as a constraint input to layout a design comprises:

selecting the one of the set of layout constraint values in view of trade-offs between performance and yield goals.

4. The method as claimed in claim 1 wherein the layout effect model comprises at least one of a well proximity effect model, and a shallow trench isolation (STI) stress model.

5. The method as claimed in claim 1 wherein the determining a set of layout constraint values that satisfy the at least one predetermined performance or yield goal in accordance with a layout effect model comprises:

varying an instance parameter of the layout effect model to determine a set of instance parameters that satisfy the at least one predetermined performance or yield goal in accordance with the layout effect model; and determining layout constraints associated with each instance parameter of the set of instance parameters to provide the set of layout constraint values.

6. The method as claimed in claim 1 wherein the determining a set of layout constraint values that satisfy the at least one predetermined performance or yield goal in accordance with a layout effect model comprises:

determining a set of minimum well distance values that satisfy the at least one predetermined performance or yield goal in accordance with a well proximity effect model.

7. The method as claimed in claim 6 wherein the determining a set of minimum well distance values that satisfy the at least one predetermined performance or yield goal in accordance with a well proximity effect model comprises:

varying an instance parameter (SCA) representing an integral of a first distribution function for scattered well dopants to determine a set of instance parameters that satisfy the at least one predetermined performance or yield goal in accordance with the well proximity effect model; and determining well keep-out constraints associated with each instance parameter of the set of instance parameters to provide the set of minimum well distance values.

8. The method as claimed in claim 7 wherein the selecting one of the set of layout constraint values as a constraint input to layout a design comprises:

selecting one of the set of instance parameters in view of trade-offs between performance and yield goals; and inputting minimum well distances corresponding to the selected one of the set of instance parameters as the constraint input.

9. The method as claimed in claim 7 wherein the well proximity effect model models at least one of threshold voltage ($V_{th}$), a second-order body bias coefficient (K2) and effective mobility ($\mu_{eff}$) as a function of SCA.

10. The method as claimed in claim 1 wherein sizing devices in the selected circuit topology and the determining a set of layout constraint values that satisfy the at least one predetermined performance or yield goal in accordance with a layout effect model are performed together.

11. A non-transitory computer-readable medium storing instructions, which, when executed by a processor, cause the processor to execute a method of proximity-aware circuit design for a selected circuit topology for a semiconductor circuit having at least one predetermined performance or yield goal, the method comprising:

for each device in the selected circuit topology, determining a set of layout constraint values that satisfy the at least one predetermined performance or yield goal in accordance with a layout effect model;

selecting one of the set of layout constraint values as a constraint input to layout a design for said each device; and performing a design layout in accordance with the selected one of the set of layout constraint values for said each device to provide the semiconductor circuit design for a semiconductor circuit.

12. The non-transitory computer-readable medium as claimed in claim 11 wherein the method further comprises:

placing and routing each of devices in the selected circuit topology in accordance with its respective selected one of the set of layout constraint values to optimize the semiconductor circuit design in accordance with circuit specifications; and verifying the semiconductor circuit design.

13. The non-transitory computer-readable medium as claimed in claim 11 wherein the selecting one of the set of layout constraint values as a constraint input to layout a design comprises:

selecting the one of the set of layout constraint values in view of trade-offs between performance and yield goals.

14. The non-transitory computer-readable medium as claimed in claim 11 wherein the layout effect model comprises at least one of a well proximity effect model, and a shallow trench isolation (STI) stress model.

15. The non-transitory computer-readable medium as claimed in claim 11 wherein the determining a set of layout constraint values that satisfy the at least one predetermined performance or yield goal in accordance with a layout effect model comprises:

varying an instance parameter of the layout effect model to determine a set of instance parameters that satisfy the at least one predetermined performance or yield goal in accordance with the layout effect model; and determining layout constraints associated with each instance parameter of the set of instance parameters to provide the set of layout constraint values.

16. The non-transitory computer-readable medium as claimed in claim 11 wherein the determining a set of layout constraint values that satisfy the at least one predetermined performance or yield goal in accordance with a layout effect model comprises:

determining a set of minimum well distance values that satisfy the at least one predetermined performance or yield goal in accordance with a well proximity effect model.

17. The non-transitory computer-readable medium as claimed in claim 16 wherein the determining a set of minimum well distance values that satisfy the at least one predetermined performance or yield goal in accordance with a well proximity effect model comprises:

varying an instance parameter (SCA) representing an integral of a first distribution function for scattered well dopants to determine a set of instance parameters that satisfy the at least one predetermined performance or yield goal in accordance with the well proximity effect model; and determining well keep-out constraints associated with each instance parameter of the set of instance parameters to provide the set of minimum well distance values.

18. The non-transitory computer-readable medium as claimed in claim 17 wherein the selecting one of the set of layout constraint values as a constraint input to layout a design comprises:

selecting one of the set of instance parameters in view of trade-offs between performance and yield goals; and inputting minimum well distances corresponding to the selected one of the set of instance parameters as the constraint input.

19. The non-transitory computer-readable medium as claimed in claim 17 wherein the well proximity effect model models at least one of threshold voltage ($V_{th}$), a second-order body bias coefficient (K2) and effective mobility ($\mu_{eff}$) as a function of SCA.

20. The non-transitory computer-readable medium as claimed in claim 11 wherein the determining a set of layout constraint values that satisfy the at least one predetermined performance or yield goal in accordance with a layout effect model is performed at the same time as sizing devices in the selected circuit topology.

* * * * *